United States Patent
Lin et al.

(10) Patent No.: US 12,432,995 B2
(45) Date of Patent: Sep. 30, 2025

(54) COMPOUND SEMICONDUCTOR DEVICE AND FABRICATION METHOD THEREOF

(71) Applicant: UNITED MICROELECTRONICS CORP., Hsin-Chu (TW)

(72) Inventors: Da-Jun Lin, Kaohsiung (TW); Fu-Yu Tsai, Tainan (TW); Bin-Siang Tsai, Changhua County (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 518 days.

(21) Appl. No.: 17/835,956

(22) Filed: Jun. 8, 2022

(65) Prior Publication Data

US 2023/0369435 A1    Nov. 16, 2023

(30) Foreign Application Priority Data

May 16, 2022  (CN) .......................... 202210527178.6

(51) Int. Cl.
*H10D 62/85* (2025.01)
*H01L 21/285* (2006.01)
*H10D 30/01* (2025.01)
*H10D 30/47* (2025.01)
*H10D 62/824* (2025.01)
(Continued)

(52) U.S. Cl.
CPC ....... *H10D 62/85* (2025.01); *H01L 21/28575* (2013.01); *H10D 30/015* (2025.01); *H10D 30/475* (2025.01); *H10D 62/824* (2025.01); *H10D 62/8503* (2025.01); *H10D 64/01* (2025.01); *H10D 64/62* (2025.01)

(58) Field of Classification Search
CPC . H01L 29/452; H01L 29/2003; H01L 29/205; H01L 29/66462; H01L 29/41766; H01L 29/1033; H01L 29/66431; H01L 29/778–7789; H01L 29/475; H01L 21/32053; H10D 62/85; H10D 64/63; H10D 62/85; H10D 62/824; H10D 30/015; H10D 64/668; H10D 30/47; H10D 30/472; H10D 30/473; H10D 30/4732; H10D 30/4735; H10D 30/4738; H10D 30/475; H10D 30/4755; H10D 30/477

See application file for complete search history.

(56) References Cited

U.S. PATENT DOCUMENTS 7,847,410 B2  12/2010  Lee
9,590,157 B2   3/2017  Tang
(Continued)

OTHER PUBLICATIONS

Drummond, Work Functions of Transition Metal and Metal Silicides (Year: 1999).*

(Continued)

*Primary Examiner* — Britt D Hanley
*Assistant Examiner* — Jason James Greaving
(74) *Attorney, Agent, or Firm* — Winston Hsu

(57) ABSTRACT

A compound semiconductor device includes a substrate, a channel layer on the substrate, a barrier layer on the channel layer, a passivation layer on the barrier layer, and a contact area recessed into the passivation layer and the barrier layer. The channel layer is partially exposed at a bottom of the contact area. A bi-layer silicide film is disposed on the contact area. A copper contact is disposed on the bi-layer silicide film.

9 Claims, 3 Drawing Sheets

(51) Int. Cl.
*H10D 64/01* (2025.01)
*H10D 64/62* (2025.01)

(56) References Cited

U.S. PATENT DOCUMENTS

| | | | | |
|---|---|---|---|---|
| 2010/0117146 | A1* | 5/2010 | Ikeda | H10D 30/475 438/270 |
| 2015/0021662 | A1* | 1/2015 | Basu | H10D 30/60 438/285 |
| 2015/0145004 | A1* | 5/2015 | Inoue | H10D 64/693 438/270 |
| 2017/0301781 | A1* | 10/2017 | Boles | H10D 62/116 |
| 2018/0240753 | A1* | 8/2018 | LaRoche | H01L 21/28575 |
| 2019/0081154 | A1* | 3/2019 | Watanabe | H10D 30/015 |
| 2020/0044048 | A1* | 2/2020 | Yu | H01L 21/32055 |

OTHER PUBLICATIONS

Kang et. al., Characterization of Resistivity and Work Function of sputtered-TaN Film for Gate Electrode Applications (Year: 2003).*

* cited by examiner

COMPOUND SEMICONDUCTOR DEVICE AND FABRICATION METHOD THEREOF

BACKGROUND OF THE INVENTION

1. Field of the Invention

The present invention relates to the field of semiconductor technology, in particular to a method for forming a contact on a compound semiconductor device.

2. Description of the Prior Art

High electron mobility transistors (HEMTs) are known in the art. GaN HEMTs are widely used in high-frequency, high-power amplifier components due to high breakdown voltage, high saturation electron moving speed and high operation temperature.

In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

Low-resistance, stable contacts are critical for the performance and reliability of integrated circuits, and their preparation and characterization are major efforts in circuit fabrication.

SUMMARY OF THE INVENTION

It is one object of the present invention to provide a method for fabricating a compound semiconductor device having low-resistance and stable contact structure.

One aspect of the invention provides a compound semiconductor device including a substrate, a channel layer on the substrate, a barrier layer on the channel layer, a passivation layer on the barrier layer, and a contact area recessed into the passivation layer and the barrier layer. The channel layer is partially exposed at a bottom of the contact area. A bi-layer silicide film is disposed on the contact area. A copper contact is disposed on the bi-layer silicide film.

According to some embodiments, the bi-layer silicide film comprises a first silicide layer in direct contact with the channel layer and a second silicide layer in direct contact with the first silicide layer.

According to some embodiments, the first silicide layer has a work function smaller than that of the second silicide layer, and the second silicide layer has a work function smaller than that of a diffusion barrier layer of the copper contact.

According to some embodiments, the first silicide layer has a thickness smaller than that of the second silicide layer.

According to some embodiments, the first silicide layer has a thickness smaller than or equal to 200 angstroms.

According to some embodiments, the second silicide layer has a thickness ranging between 200 angstroms and 500 angstroms.

According to some embodiments, the first silicide layer comprises TiSi, the second silicide layer comprises TaSi, and the diffusion barrier comprises TaN.

According to some embodiments, the channel layer comprises GaN.

According to some embodiments, the barrier layer comprises AlGaN.

According to some embodiments, the passivation layer comprises silicon nitride, silicon oxide, aluminum oxide, hafnium oxide, or aluminum nitride.

Another aspect of the invention provides a method for forming a compound semiconductor device. A substrate is provided. A channel layer is formed on the substrate. A barrier layer is formed on the channel layer. A passivation layer is formed on the barrier layer. A contact area is formed by etching through the passivation layer and the barrier layer. The channel layer is partially exposed at a bottom of the contact area. A bi-layer silicide film is formed on the contact area. A copper contact is formed on the bi-layer silicide film.

According to some embodiments, the bi-layer silicide film comprises a first silicide layer in direct contact with the channel layer and a second silicide layer in direct contact with the first silicide layer.

According to some embodiments, the first silicide layer has a work function smaller than that of the second silicide layer, and the second silicide layer has a work function smaller than that of a diffusion barrier layer of the copper contact.

According to some embodiments, the first silicide layer has a thickness smaller than that of the second silicide layer.

According to some embodiments, the first silicide layer has a thickness smaller than or equal to 200 angstroms.

According to some embodiments, the second silicide layer has a thickness ranging between 200 angstroms and 500 angstroms.

According to some embodiments, the first silicide layer comprises TiSi, the second silicide layer comprises TaSi, and the diffusion barrier comprises TaN.

According to some embodiments, the channel layer comprises GaN.

According to some embodiments, the barrier layer comprises AlGaN.

According to some embodiments, the passivation layer comprises silicon nitride, silicon oxide, aluminum oxide, hafnium oxide, or aluminum nitride.

According to some embodiments, the method further comprises the steps of forming a buffer layer on the substrate; and forming the channel layer on the buffer layer, wherein the buffer layer has a band gap larger than that of the channel layer.

According to some embodiments, the buffer layer comprises AlN, AlGaN, or GaN.

According to some embodiments, the substrate comprises SiC, Sapphire, Si, $Al_2O_3$, AlN, or GaN.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
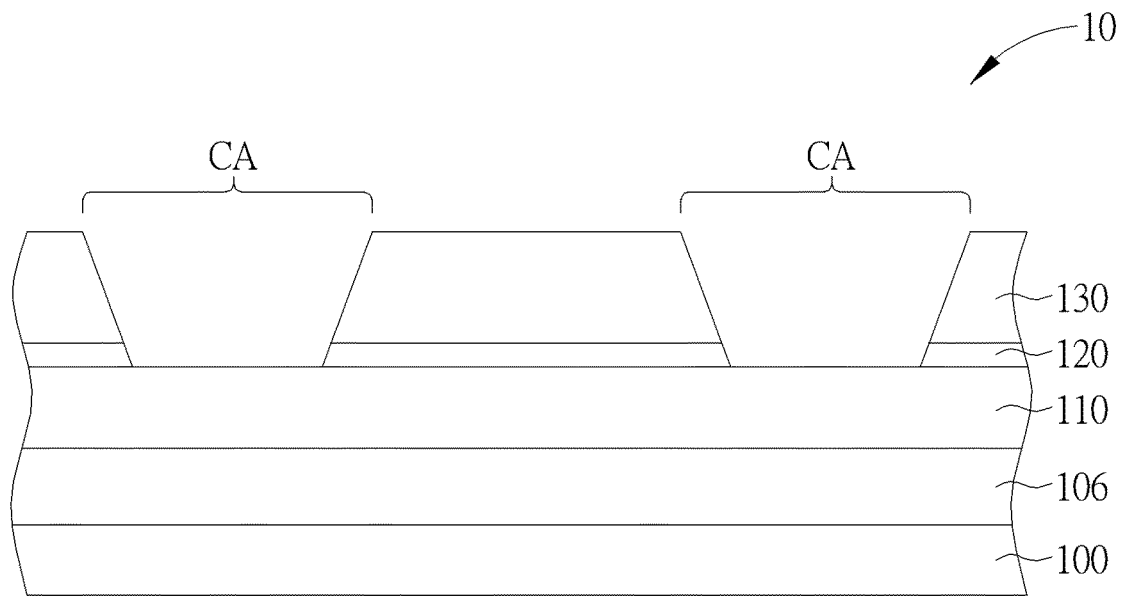
FIG. 1 to FIG. 6 are schematic diagrams illustrating a method for forming a compound semiconductor device according to an embodiment of the present invention.

Please refer to FIG. 1 to FIG. 6, which are schematic diagrams of a method for forming a compound semiconductor device 10 according to an embodiment of the present invention. As shown in FIG. 1, first, a substrate 100 is provided. According to an embodiment of the present invention, the substrate 100 may include SiC, sapphire, Si, $Al_2O_3$, AlN or GaN. Next, a buffer layer 106 may be formed on the substrate 100. According to an embodiment of the present invention, for example, the buffer layer 106 may include AlN, AlGaN, or GaN.

Next, a channel layer 110 is formed on the buffer layer 106. According to an embodiment of the present invention, for example, the channel layer 110 may include GaN. According to an embodiment of the present invention, the band gap of the buffer layer 106 is larger than the band gap of the channel layer 110.

Next, a barrier layer 120 is formed on the channel layer 110. According to an embodiment of the present invention, for example, the barrier layer 120 may include AlGaN. A passivation layer 130 is then formed on the barrier layer 120. According to an embodiment of the present invention, for example, the passivation layer 130 may include silicon nitride, silicon oxide, aluminum oxide, hafnium oxide, or aluminum nitride.

Next, photolithography and etching processes are performed to etch through the passivation layer 130 and the barrier layer 120, thereby forming a contact area CA. The channel layer 110 is partially exposed at the bottom of the contact area CA.

Figure 2:
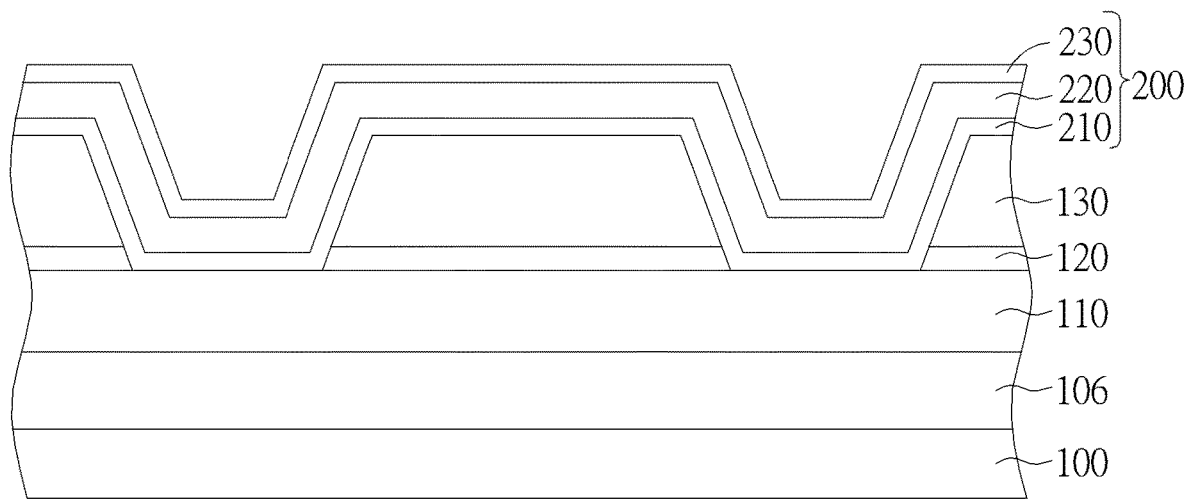

As shown in FIG. 2, next, a sandwich structure 200 is conformally formed on the passivation layer 130 and the contact area CA, which includes a first metal layer 210, an intermediate layer 220 and a second metal layer 230. According to an embodiment of the present invention, for example, the first metal layer 210 may be a titanium (Ti) layer, the intermediate layer 220 may be a silicon layer, and the second metal layer 230 may be a tantalum (Ta) layer.

Figure 3:
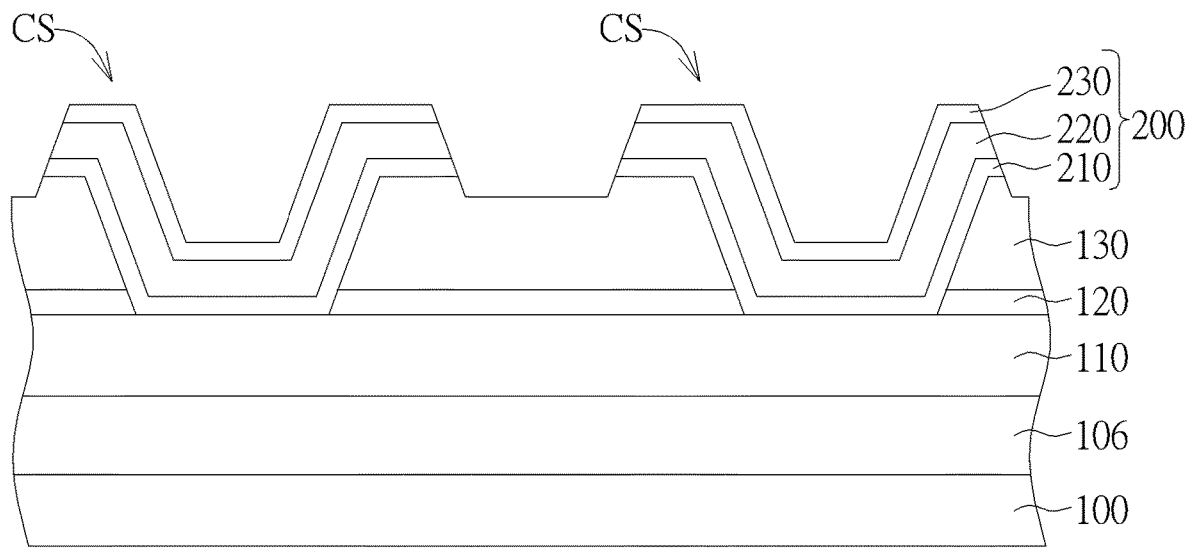

As shown in FIG. 3, lithography and etching processes are performed to pattern the sandwich structure 200 to form the contact structure CS. According to an embodiment of the present invention, the contact structure CS may serve as a drain or a source of the compound semiconductor device 10.

Figure 4:
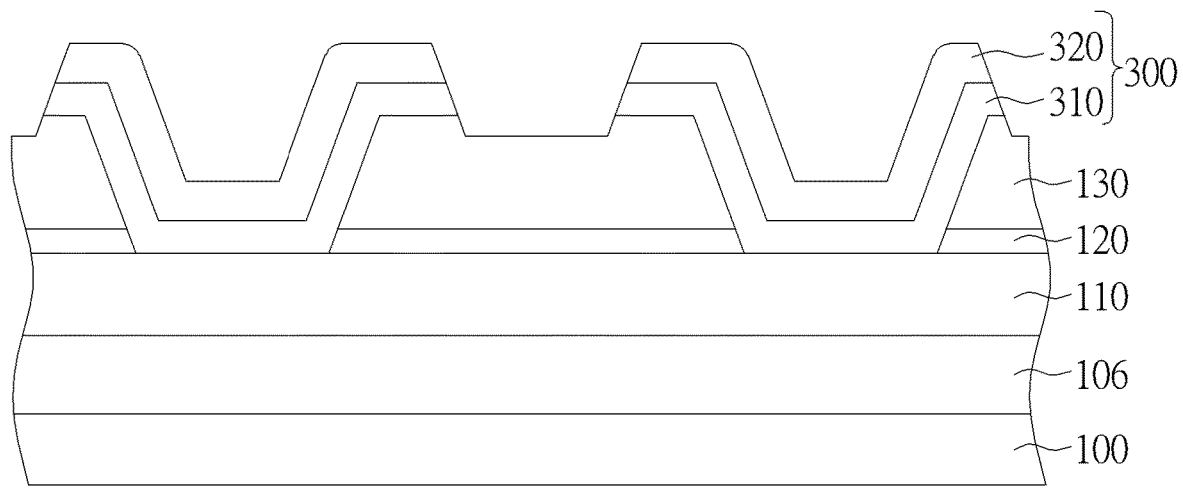

As shown in FIG. 4, an annealing process is then performed to make the intermediate layer 220 completely react with the first metal layer 210 and the second metal layer 230, thereby forming a bi-layer silicide film 300 on the contact area CA.

According to an embodiment of the present invention, for example, the bi-layer silicide film 300 includes a first silicide layer 310 in direct contact with the channel layer 110 and a second silicide layer 320 in direct contact with the first silicide layer 310.

According to an embodiment of the present invention, for example, the first silicide layer 310 includes TiSi, and the second silicide layer 320 includes TaSi.

According to an embodiment of the present invention, for example, the thickness of the first silicide layer 310 is smaller than the thickness of the second silicide layer 320.

According to an embodiment of the present invention, for example, the thickness of the first silicide layer 310 is less than or equal to 200 angstroms. According to an embodiment of the present invention, the thickness of the second silicide layer 320 is 200-500 angstroms.

Figure 5:
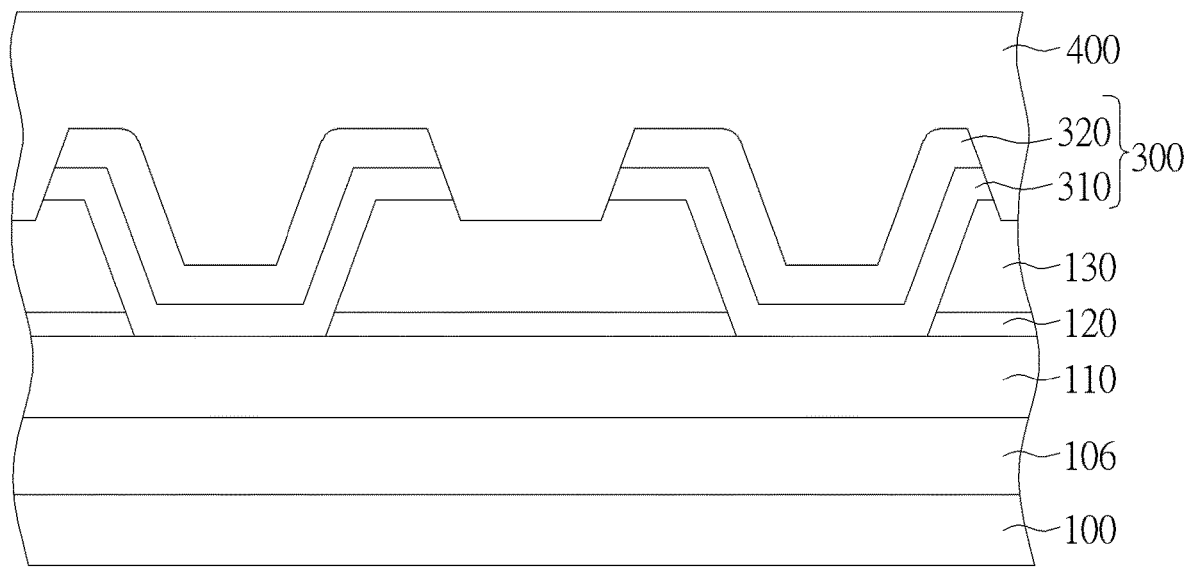

As shown in FIG. 5, a dielectric layer 400 is deposited on the bi-layer silicide film 300 and on the passivation layer 130. According to an embodiment of the present invention, for example, the dielectric layer 400 may include a silicon oxide layer.

Figure 6:
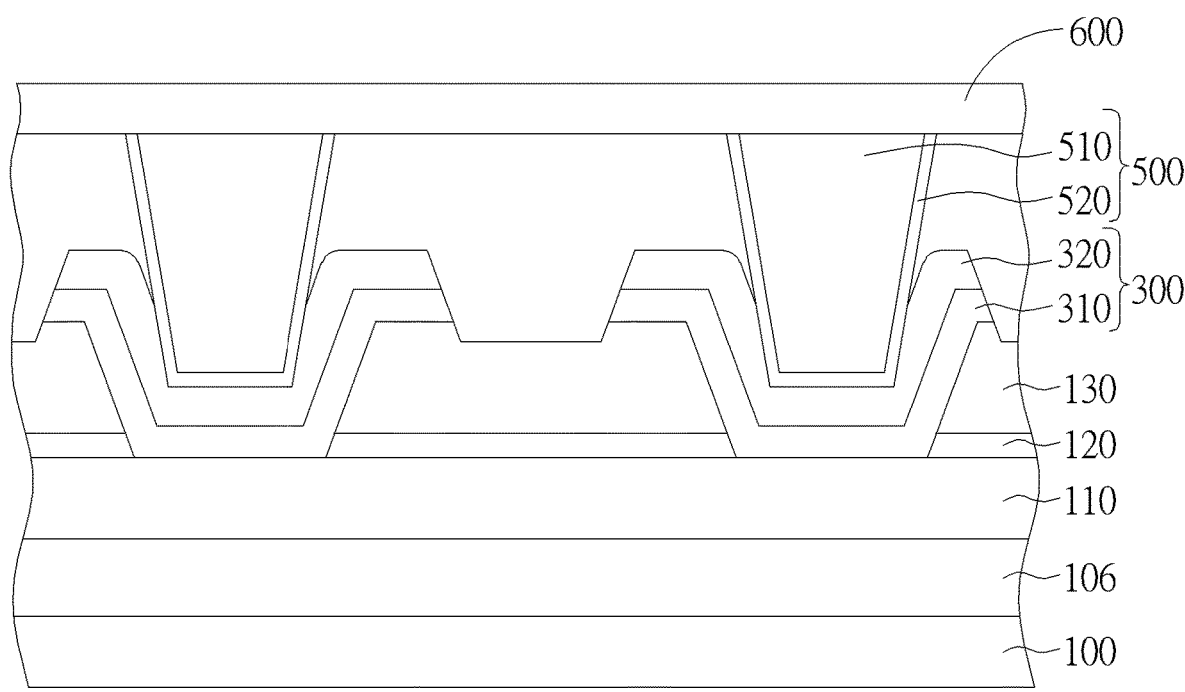

As shown in FIG. 6, a copper contact 500 is formed in the dielectric layer 400 on the bi-layer silicide film 300. According to an embodiment of the present invention, the copper contact 500 includes a copper metal layer 510 and a diffusion barrier layer 520. According to an embodiment of the present invention, for example, the diffusion barrier layer 520 may include TaN. Subsequently, an etch stop layer 600, for example, a silicon nitride layer, may be deposited on the copper contact 500 and on the dielectric layer 400.

According to an embodiment of the present invention, the work function of the first silicide layer 310 is smaller than that of the second silicide layer 320, and the work function of the second silicide layer 320 is smaller than that of the diffusion barrier layer 520 of the copper contact 500. Therefore, a contact interface with a work function gradient is formed between the copper metal layer 510 and the channel layer 110.

As can be seen from FIG. 6, the compound semiconductor device 10 includes a substrate 100, a channel layer 110, a barrier layer 120 and a passivation layer 130. According to an embodiment of the present invention, the channel layer 110 includes GaN. According to an embodiment of the present invention, the barrier layer 120 includes AlGaN. According to an embodiment of the present invention, the passivation layer 130 includes silicon nitride, silicon oxide, aluminum oxide, hafnium oxide or aluminum nitride.

According to an embodiment of the present invention, the compound semiconductor device 10 further includes a contact area CA recessed into the passivation layer 130 and the barrier layer 120. Part of the channel layer 110 constitutes the bottom of the contact area CA.

According to an embodiment of the present invention, the compound semiconductor device 10 further includes a bi-layer silicide film 300 on the contact area CA, and a copper contact 500 on the bi-layer silicide film 300.

According to an embodiment of the present invention, the bi-layer silicide film 500 includes a first silicide layer 310 in direct contact with the channel layer 110 and a second silicide layer 320 in direct contact with the first silicide layer 310.

According to the embodiment of the present invention, the work function of the first silicide layer 310 is smaller than that of the second silicide layer 320, and the work function of the second silicide layer 320 is smaller than that of the diffusion barrier layer 520 of the copper contact 500. A contact interface with work function gradient is formed between the copper metal layer 510 and the channel layer 110.

According to the embodiment of the present invention, the thickness of the first silicide layer 310 is smaller than the thickness of the second silicide layer 320. According to an embodiment of the present invention, the thickness of the first silicide layer 310 is less than or equal to 200 angstroms. According to an embodiment of the present invention, the thickness of the second silicide layer 320 is 200-500 angstroms.

According to an embodiment of the present invention, the first silicide layer 310 includes TiSi, the second silicide layer 320 includes TaSi, and the diffusion barrier layer 520 includes TaN.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A compound semiconductor device, comprising:
   a substrate;
   a buffer layer on the substrate;
   a channel layer on the buffer layer, wherein the buffer layer has a band gap larger than a band gap of the channel layer;
   a barrier layer on the channel layer;
   a passivation layer on the barrier layer;
   a contact area recessed into the passivation layer and the barrier layer, wherein the channel layer is partially exposed at a bottom of the contact area;
   a bi-layer silicide film on the contact area, wherein the bi-layer silicide film comprises a first silicide layer in direct contact with the channel layer and a second silicide layer in direct contact with the first silicide layer, wherein the second silicide layer comprises a recessed region formed by inclined sidewalls and a bottom surface; and
   a copper contact on the bi-layer silicide film, wherein the copper contact comprises a diffusion barrier layer in direct contact with the second silicide layer, and a copper metal layer in direct contact with the diffusion barrier layer, wherein the copper contact is formed only within the recessed region.

2. The compound semiconductor device according to claim 1, wherein the first silicide layer has a work function smaller than that of the second silicide layer, and the second silicide layer has a work function smaller than that of the diffusion barrier layer of the copper contact.

3. The compound semiconductor device according to claim 1, wherein the first silicide layer has a thickness smaller than that of the second silicide layer, and wherein the first silicide layer is in direct contact with a sidewall of the barrier layer.

4. The compound semiconductor device according to claim 3, wherein the first silicide layer has a thickness smaller than or equal to 200 angstroms.

5. The compound semiconductor device according to claim 4, wherein the second silicide layer has a thickness ranging between 200 angstroms and 500 angstroms.

6. The compound semiconductor device according to claim 2, wherein the first silicide layer comprises TiSi, the second silicide layer comprises TaSi, and the diffusion barrier comprises TaN.

7. The compound semiconductor device according to claim 1, wherein the channel layer comprises GaN, wherein the buffer layer comprises AlN, AlGaN, or GaN.

8. The compound semiconductor device according to claim 1, wherein the barrier layer comprises AlGaN.

9. The compound semiconductor device according to claim 1, wherein the passivation layer comprises silicon nitride, silicon oxide, aluminum oxide, hafnium oxide, or aluminum nitride.

* * * * *